(12) United States Patent
Pringle, Jr. et al.

(10) Patent No.: US 6,292,002 B1
(45) Date of Patent: Sep. 18, 2001

(54) CRYSTAL RESONANT FREQUENCY SENSOR

(75) Inventors: Ralph Pringle, Jr.; Felix E. Morgan, both of Albuquerque, NM (US)

(73) Assignee: The B. F. Goodrich Company, Charlotte, NC (US)

( * ) Notice: Subject to any disclaimer, the term of this patent is extended or adjusted under 35 U.S.C. 154(b) by 0 days.

(21) Appl. No.: 09/375,211

(22) Filed: Aug. 16, 1999

(51) Int. Cl.$^7$ .......................... G01R 29/22; G01R 23/14; G01R 23/165; G01R 23/00
(52) U.S. Cl. .................. 324/727; 324/76.31; 324/633; 324/76.29; 324/76.39; 324/76.41; 324/76.44; 324/76.46; 324/76.49; 324/76.51; 73/579; 331/158
(58) Field of Search .................. 324/727, 76.36, 324/633, 76.29, 76.31, 76.39, 76.41, 76.44, 76.46, 76.49, 76.51; 73/579, 54.41; 348/732, 735; 331/2, 158, 183, 19, 25

(56) References Cited

U.S. PATENT DOCUMENTS

| | | | | |
|---|---|---|---|---|
| 3,614,630 | * | 10/1971 | Rorden | 455/260 |
| 3,634,887 | * | 1/1972 | Buchholz et al. | 342/190 |
| 3,680,124 | * | 7/1972 | Stone et al. | 342/424 |
| 3,806,634 | * | 4/1974 | Abbott et al. | 348/507 |
| 4,052,673 | * | 10/1977 | Herzog | 455/112 |
| 4,093,949 | * | 6/1978 | Evans | 342/98 |
| 4,227,158 | * | 10/1980 | Schroeder et al. | 331/2 |
| 4,321,706 | * | 3/1982 | Craft | 375/295 |
| 4,366,451 | * | 12/1982 | Kowal | 331/20 |
| 4,461,035 | * | 7/1984 | Sakamoto | 455/192.2 |
| 4,477,839 | * | 10/1984 | Sugiyama | 386/19 |
| 4,612,819 | * | 9/1986 | Kempas | 74/5.46 |
| 4,651,571 | * | 3/1987 | McGlade | 73/773 |
| 4,668,331 | * | 5/1987 | Ostriker | 117/8 |
| 4,735,906 | * | 4/1988 | Bastiaans | 436/527 |
| 4,771,231 | * | 9/1988 | Cross | 324/76.36 |
| 4,789,804 | * | 12/1988 | Karube et al. | 310/311 |
| 5,179,028 | * | 1/1993 | Vali et al. | 436/524 |
| 5,705,399 | * | 1/1998 | Larue | 436/501 |
| 5,952,818 | * | 9/1999 | Zhang et al. | 324/96 |
| 6,006,589 | * | 12/1999 | Rodahl et al. | 73/54.41 |
| 6,111,416 | * | 8/2000 | Zhang et al. | 324/753 |
| 6,111,512 | * | 8/2000 | Sugimoto et al. | 340/577 |
| 6,114,971 | * | 9/2000 | Nysen | 340/10.34 |
| 6,116,536 | * | 9/2000 | Williamson | 244/3.14 |

* cited by examiner

*Primary Examiner*—Glenn W. Brown
*Assistant Examiner*—Wasseem H. Hamdan

(57) ABSTRACT

A method and apparatus for measuring the frequency of a desired resonant mode of a crystal arrangement, or other two-port device, during an automated operation. The crystal arrangement, or other two-port device, is placed into a test circuit and subjected to a sinusoidal test signal of known frequency. Based upon the output response of the crystal arrangement to the test signal, the frequency of the test signal is changed such that the test signal rapidly converges on a desired mode of operation of the crystal arrangement. This is accomplished by first noting a desired increase in amplitude of the output response of the crystal arrangement, followed by measuring an error signal related to the desired crystal arrangement mode of operation. When the error equals a predetermined value the frequency of the sinusoidal test signal is the frequency of the desired mode.

13 Claims, 12 Drawing Sheets

CRYSTAL RESONANT FREQUENCY SENSOR

BACKGROUND OF THE INVENTION

1. Field of the Invention

The present invention relates to frequency measurement and, more particularly, to frequency measurements of various quartz crystal resonant modes.

2. Description of the Prior Art

It is often desirable to determine the resonant modes of a quartz crystal arrangement where the frequency information may be used in scientific study, for example. Frequency characteristics of interest may include resonant frequencies, inharmonic overtones, and harmonic modes of the crystal arrangement.

Historically, methods of measuring resonant modes of a crystal include swept frequency sinusoidal analysis and crystal oscillator testing. The swept frequency sinusoidal analysis involves applying a sinusoidal signal to the crystal arrangement and sweeping the frequency of the sinusoidal input signal through a frequency range of interest. Based on the response of the crystal arrangement to the sinusoidal input, certain frequency characteristics can be obtained. The swept frequency sinusoidal analysis, however, is often tedious and overly time consuming, and often requires repetitive cycles of: providing an input signal to the crystal arrangement, changing the frequency of the input signal, measurement of the response of the crystal arrangement, comparison of the gathered information, and determining the input signal to be applied to the crystal arrangement for a subsequent measurement based on the current cycle measurement. Typically, for a high accuracy measurement very precise and expensive measurement equipment must be used. However, even when measurements are taken with the very precise and expensive equipment, errors may still arise due to human intervention during the analysis.

The crystal oscillator testing method for measuring a resonant mode of a crystal involves placing the crystal in an electronic oscillator circuit and measuring the oscillator signal frequency. Due to the resonant properties of a crystal, the electronic oscillator circuit will converge to the crystal's resonant frequency. While crystal oscillator testing is a reasonable method to determine the principal resonant frequency of a crystal, it is an undesirable method where additional resonant modes are to be measured.

OBJECTS OF THE INVENTION

It is one object of this invention to provide a method and apparatus to rapidly and accurately determine the frequency of a desired resonant mode characteristic of a crystal arrangement, or other two port device, under test without the use of complicated and expensive test equipment.

It is another object of this invention to provide a method and apparatus to rapidly determine the frequency of a desired resonant mode of a crystal arrangement, or other two port device, under test as part of a fully automated operation.

It is another object of this invention to provide a method and apparatus to rapidly determine the frequency of a desired resonant mode of a crystal arrangement under test while discriminating between several different modes of oscillation of the crystal.

It is another object of this invention to provide a method and apparatus for measuring multiple, closely spaced resonant frequencies of a crystal arrangement, or other two port device, under test.

It is another object of this invention to provide a precision, linear crystal-controlled oscillator utilizing an inexpensive crystal and a voltage controlled oscillator.

SUMMARY OF THE INVENTION

The foregoing and other problems are overcome and the objects of the invention are realized by methods and apparatus in accordance with embodiments of this invention. In accordance with one embodiment of the invention an apparatus and method are provided for measuring desired resonant modes of a crystal arrangement, or other two-port device. First, based upon calculated operating parameters related to a desired resonant mode of the crystal arrangement, the apparatus and method measure the passive response of the crystal arrangement to a sinusoidal input of a known frequency. The passive response of the crystal arrangement is measured by sweeping the frequency until the amplitude of the response is above a calculated threshold value. Second, the apparatus and method measure an error signal. The error signal represents the difference in frequency between the sinusoidal input and the desired resonant mode, generated, in part, as a result of the desired resonant mode of the crystal arrangement. Additionally, the apparatus and method fine tune, or closed-loop feedback adjust the frequency of the sinusoidal input such that the error signal rapidly converges to a predetermined value. When the error signal reaches the predetermined value, the frequency of the sinusoidal input is the frequency of the desired resonant mode of the crystal arrangement.

In accordance with the present invention, a crystal resonant frequency sensor includes a controller whose output is responsive to values measured at a minimum of two inputs, a voltage-controlled oscillator adapted to provide a signal whose frequency is responsive to a command signal, a phase shifter, a first and second multiplier and a first and second filter.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
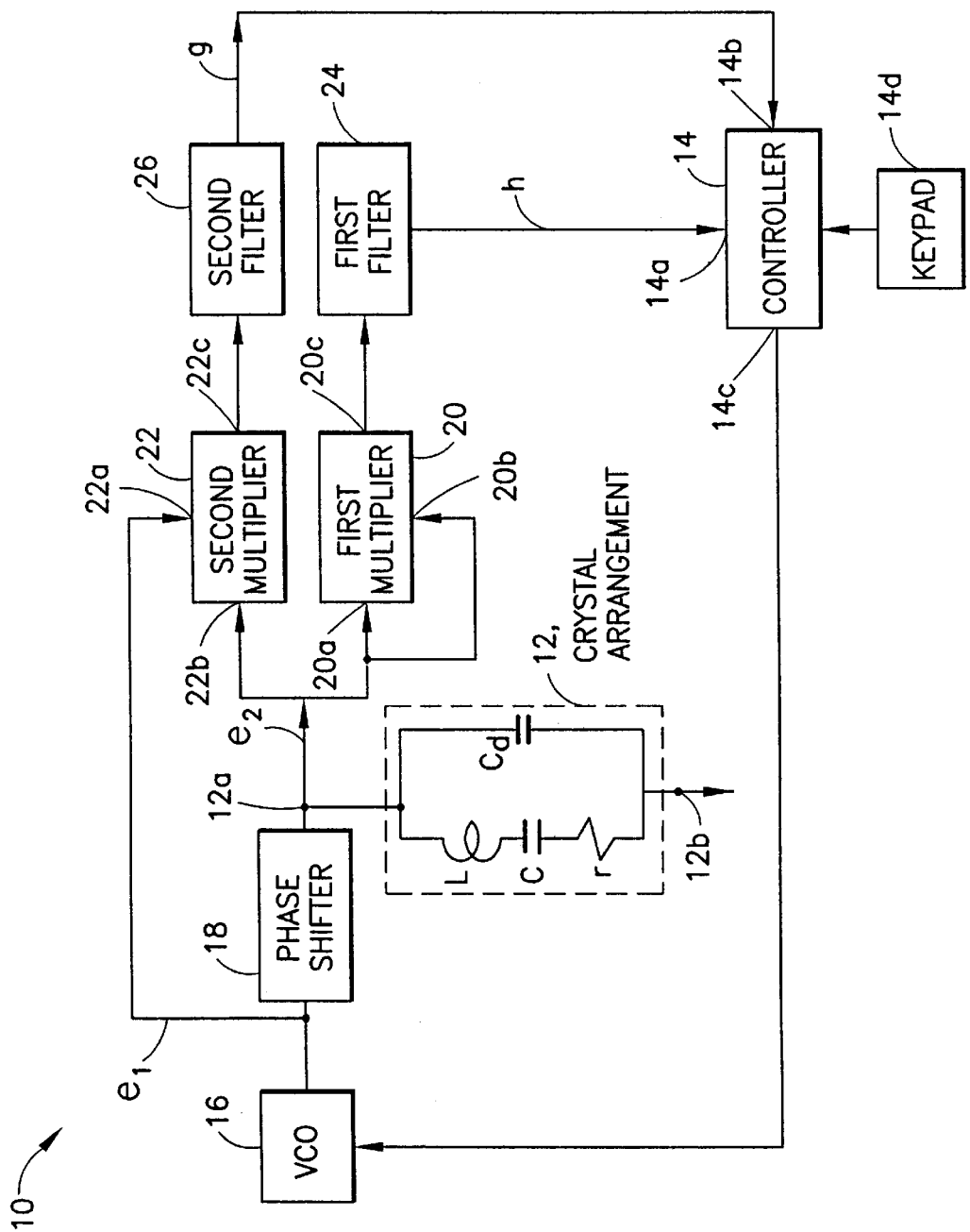
FIG. 1 is a schematic diagram of an embodiment of a crystal resonant frequency sensor in accordance with this invention.

Referring to the accompanying drawings, FIG. 1 depicts an embodiment of a crystal resonant frequency sensor. Specifically, FIG. 1 depicts a crystal resonant frequency sensor 10 comprising a controller 14, a voltage-controlled oscillator (VCO) 16, a phase shifter 18, a first multiplier 20, a second multiplier 22, a first filter 24, and a second filter 26. A crystal arrangement 12 to be characterized is shown connected between the output 12a of the phase shifter 18 and a ground 12b. The voltage $e_2$ is measured with respect to ground at the output 12a of the phase shifter 18. The crystal arrangement 12 has an input 12a and an output 12b. The crystal arrangement 12 may comprise a crystal element which inherently comprises stray capacitance ($C_d$), series capacitance (C), a value Q representing a relationship between energy stored and energy dissipated per cycle, and at least one resonant mode. The crystal arrangement 12 may be modeled as a one mode equivalent circuit, as shown, comprising stray capacitance ($C_d$) coupled in parallel to a series combination of inductance (L), parallel capacitance (C) and resistance (r), or the crystal arrangement 12 may generally comprise components forming a circuit which has at least one resonant mode.

The controller 14 further comprises a first input 14a, a second input 14b, and an output 14c. Optionally, the controller 14 may further include an input 14d for user inputted parameters. The first multiplier 20 and the second multiplier 22 both further comprise a first input 20a, 22a, and a second input 20b, 22b, and an output 20c, 22c, respectively. The output 14c of the controller 14 electrically communicates with a control signal input of the VCO 16. The output $e_1$ of the VCO 16 is electrically coupled with an input to the phase shifter 18, and the first input 22a of the second multiplier 22. The output 12a of phase shifter 18 is electrically coupled to the second input 22b of the second multiplier 22, the first input 20a of the first multiplier 20, and the second input 20b of the first multiplier 20. The crystal arrangement 12 under test is electrically connected in shunt with the phase shifter 18, between the phase shifter 18 and the multipliers 20, 22 as shown. Thus, the signal $e_2$ is generated, in part, by the passive response of crystal arrangement 12 to the output signal $e_1$ of the VCO 16.

The first filter 24 and the second filter 26 both comprise an input and an output. The output 20c of the first multiplier 20 is electrically coupled to the input of the first filter 24. The output 22c of the second multiplier 22 is electrically coupled to the input of the second filter 26. Additionally, the output of the first filter 24 is electrically coupled to the input 14a of the controller 14. The output of the second filter 26 is electrically coupled to the input 14b of the controller 14. The input 14a of the controller 14, denoted h in FIG. 1, represents a signal which is proportional to the amplitude or modulus of the signal $e_2$. The input 14b of the controller 14, denoted g in FIG. 1, represents an error directly related to the phase relationship of the signal $e_1$ with respect to the signal $e_2$.

In operation, the sensor 10 operates in either an open-loop mode or a closed-loop mode. The sensor 10, after an initialization sequence, operates in the open-loop mode. As a precursor to initiating the open-loop mode of operation a user inputs one or more parameters related to a desired resonant mode of the crystal arrangement 12 under test. The inputted parameters may include values of Q, a ratio of capacitance representing a relationship between stray capacitance ($C_d$) across the crystal and crystal series capacitance (C), and the approximate value of the resonant frequency related to the desired resonant mode. The user may input the parameters using any suitable means, such as keypad 14d that forms a part of controller 14, or a computer (not shown) in serial communication with a data port of the controller 14. Based on the user input, the controller 14 calculates operating parameters which may comprise a gain (K) which the controller 14 applies to the input value of h and g, a threshold value ($h_{th}$) which is to compared to the input value of h, and sweep parameters, including initial and peak oscillator voltage values corresponding to the desired frequency range of operation along with a starting point frequency and a frequency sweep rate. It has been discovered through testing that only approximate values of the above parameters are needed in order to acquire the frequency of the desired mode of a crystal arrangement 12 under test. However, the ability of the crystal resonant frequency sensor to rapidly converge on the frequency of a desired mode is directly related to the calculated parameters, as will become apparent.

The controller 14, the VCO 16, the phase shifter 18, the first multiplier 20, the first filter 24, and the crystal arrangement 12 comprise a control loop during the open-loop mode of operation. In the open-loop mode the input 14a (h) of the controller 14 is enabled and input 14b (g) of the controller 14 is ignored. Generally, in the open-loop mode a sinusoidal signal $e_1$ with a frequency within the calculated frequency range is provided, by way of the phase shifter 18, to the crystal arrangement 12. In response to this sinusoidal input, the crystal arrangement 12 passively provides an output signal $e_2$. The first multiplier 20 and the first filter 24 generate a signal h which is proportional to crystal arrangement 12 output signal $e_2$. The frequency of the sinusoidal signal $e_1$ is then adjusted until the magnitude of the value of h exceeds the calculated threshold value $h_{th}$. An increasing value of h is an indication that the sinusoidal frequency of signal eis approaching the desired resonant frequency of the crystal arrangement 12. Thus, when the value of h exceeds the predetermined threshold value $h_{th}$ the corresponding frequency of signal $e_1$ is assumed to be approaching the desired resonant frequency of the crystal arrangement 12, and the controller 14 initiates the closed-loop mode of operation.

More specifically, the controller 14 initiates the open-loop mode by providing a signal 14c to the VCO 16 commanding the VCO 16 to output a sinusoidal signal $e_1$ at a frequency which is within the calculated frequency range such that the value of h initially does not exceed the calculated threshold value $h_{th}$. Typically, the initial frequency of sinusoidal signal $e_1$ is at a limit of the calculated frequency range, the lower frequency limit of the range, for example. While the phase shifter 18 is physically in the path of the open-loop mode of operation, it is of little concern during the open-loop mode of operation since the amplitude of the output signal $e_2$ of the phase shifter 18 is unchanged by the phase shifter 18 itself. However, in response to the signal $e_1$, the crystal arrangement 12 passively provides the signal $e_2$. Thus, signal $e_2$ is related to the frequency characteristics of the crystal arrangement 12.

The first multiplier 20 and the first filter 24 work together to act as an amplitude demodulator for the signal $e_2$. One skilled in the art of electronics will recognize that the multiplier produces signals near zero frequency and at twice the input frequency that are proportional to the amplitude of the input signal. The low-pass filter allows a direct current (DC) representation of the signal to be available for the further operations. In a preferred embodiment, the first filter 14 is a low pass filter. The low pass filter has a cutoff frequency for h set at a fraction of the resonant frequency ($\omega_o$). Note, the specific design of the sensor 10 determines the cutoff frequency of the low pass filter, which must exclude $\omega_o$ and $2\omega_o$, and must be large enough to pass the frequency sweep rate transients. The controller 14 then measures the signal h and compares the measured value of h with the predetermined threshold value $h_{th}$. If the measured value of h is less than the threshold value $h_{th}$, the controller 14 adjusts the output 14c to command the VCO 16 to adjust the frequency of the signal $e_1$ such that the value of h approaches the threshold value $h_{th}$.

Figure 2:
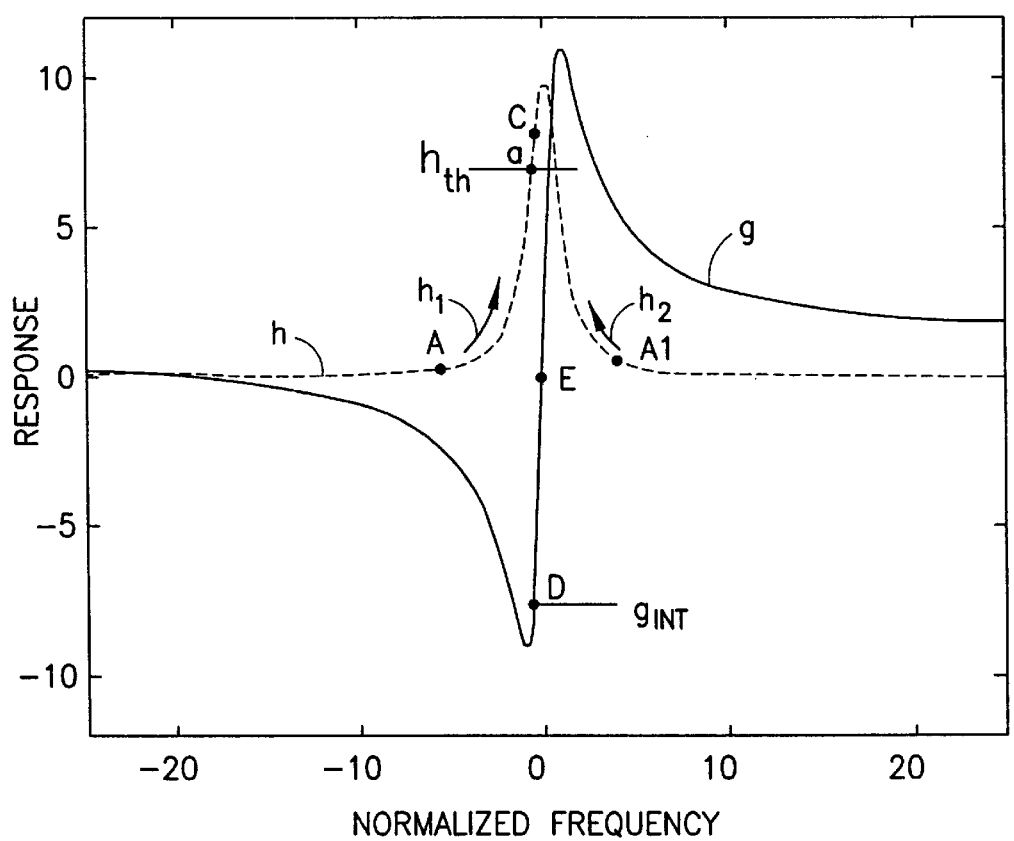
FIG. 2 is a graph that illustrates two signals of a crystal resonant frequency sensor, plotted with respect to normalized frequency.

Referring momentarily to FIG. 2, a typical normalized steady-state response of h versus frequency is graphically shown. For clarity the curve representing h is shown as a dashed line. As described above, the initial frequency selection for signal $e_1$ is calculated to produce an initial value of h which is below the calculated threshold value $h_{th}$, point A on the graph, for example. As the controller 14 sweeps the frequency of signal $e_1$ towards the desired resonant frequency of the crystal arrangement 12 under test, the value of h will approach the value of $h_{th}$, depicted by point B, in the direction of arrow $h_1$. When the value of h surpasses the value of $h_{th}$, depicted by point C, the crystal resonant frequency sensor enters the closed-loop mode of operation. While this example depicts the response of the present invention to an initial value of h corresponding to a frequency which is lower than the frequency of the desired mode, the outcome would be similar for an initial value of h whose corresponding frequency is greater than the frequency of the desired mode. As discussed above, the controller 14 commands the VCO 16 to adjust the frequency of the signal $e_1$ such that the value of h approaches the threshold value $h_{th}$. If the initial value of h corresponded to a frequency which was greater than the frequency of the desired mode of crystal arrangement 12, shown as point A1, the controller 14 would then command the VCO 16 to decrease the frequency of signal $e_1$. The decrease in frequency of signal $e_1$ causes the value of h to move towards the value of $h_{th}$ along the path indicated by arrow $h_2$. As discussed above, when the value of h surpasses the value of $h_{th}$ the crystal resonant frequency sensor enters the closed-loop mode of operation.

It is important to note that the controlled operation of the VCO 16 can be utilized in preliminarily determining parameters of different crystal arrangements. For example, for particular crystal arrangements where the crystals are in contact with a liquid or suspended in a liquid, the oscillator can be commanded to sweep through a frequency range and the corresponding value of h can be measured. This information can be used during a subsequent measurement of a resonant mode frequency by the crystal resonant frequency sensor. The negative feedback nature of the crystal resonant frequency sensor is an advantage since it is less sensitive to varying parameters of crystal arrangements, such as the one described above, than a positive feedback system, such as an oscillator.

Turning back to FIG. 1, the controller 14, the VCO 16, the phase shifter 18, the second multiplier 22, the second filter 26, and the crystal arrangement 12 comprise the control loop during the closed-loop mode of operation. In the closed-loop mode the controller 14 adjusts the frequency of the VCO 16 in order to drive g towards zero. As the measured value of g approaches the predetermined value, the corresponding frequency of the VCO 16 approaches the resonant frequency of the crystal arrangement 12.

More specifically, as stated above, once the value of h as measured by the controller 14 is greater than the predetermined value $h_{th}$, the closed-loop mode of operation is initiated. During the closed-loop mode of operation the controller also enables input 14b (g). This signal (g) is the primary control signal, but 14a (h) is used during the closed-loop mode to test for convergence. When the frequency of signal $e_1$ approaches the resonant frequency of the crystal arrangement 12, the phase of signal $e_2$ with respect to signal $e_1$ approaches 90° and the resultant output 20c (g) of the second multiplier approaches a zero value. The output 22c of the second multiplier 22 is then provided to the input of the second filter 26 where unwanted frequency components of the signal are filtered. In a preferred embodiment the second filter 26 is a low pass filter whose cutoff frequency for g must pass the same requirements as h but additionally be significantly larger than the bandwidth of the servo loop. The output of the second filter 26 is provided as input 14b (g) to the controller 14. When the absolute value of the input signal 14b (g) of controller 14 is measured to be less than some convergence value, the corresponding frequency of signal $e_1$ is the desired resonant frequency of the crystal arrangement 12 under test. The resonant frequency can be determined, for example, from the voltage used for controlling the VCO, or from measurements of the output of the VCO using a counter. For low accuracy applications, the resonant frequency can be determined from the VCO control voltage, after calibration of the VCO. For high accuracy applications, one of two methods for determining resonant frequency can be utilized. First, an expensive VCO is used where the VCO voltage is calibrated and the resonant frequency measurement is derived from the VCO voltage. Second, an ordinary VCO is used with a precise counter which can determine the resonant frequency.

Turning momentarily back to FIG. 2, the transitional phase between the open-loop mode and the closed-loop mode of operation can be more easily understood. When the value of h at the input of 14a of controller 14 exceeds the value $h_{th}$, denoted as point C of the graph, the controller 14 enters the closed-loop mode and ignores input 14a (h) while enabling input 14b (g). It should be noted that while the point C is shown clearly above the value of $h_{th}$, this is done for purposes of clarity. The actual location of point C is dependent on the resolution of the acquisition of h by the controller 14, defined in part by the gain (K) of the system. The controller 14 measures the initial value of input 14b (g) at this time, denoted $g_{int}$ at point D of the graph. As shown, the signal g is an approximately linear function over the crystal resonant bandwidth. The controller 14 then finely adjusts the frequency of signal $e_1$ such that the measured value of g at input 14b of controller 14 rapidly approaches a zero value, denoted point E of the graph. As discussed above, when the value of g is measured to be approximately zero, the frequency of the signal $e_1$ represents the desired resonant frequency of the crystal arrangement 12 under test.

If, however, the initial value of h corresponds to a signal $e_1$ frequency greater than the desired resonant frequency, the initial value of g will be positive. The controller 14, attempting to minimize g, decreases the frequency of signal $e_1$.

At this point it is important to note that the phase shifter 18 may be replaced by a generalized network in order to determine the desired resonant modes of other two-port resonant devices. Like the crystal arrangement discussed above, such two-port devices would comprise an input which receives the $e_1$ signal from the generalized network, and an output which would be measured to determine the signal $e_2$. The loop dynamics would be consistent with that stated above wherein the signal g represents an error function of the frequency error between the resonant frequency and the oscillator frequency with the value equaling a predetermined value, such as a zero value, at zero error. The generalized network would be designed such that the error function converges to the desired predetermined value.

Additionally, it would be apparent to one of ordinary skill in the art to combine all or a part of the elements described above into a single element. For example, microcontrollers or other similar microprocessor based devices have become more readily available in the past decade. Such devices, for example a controller chip from the Motorola M68HCXX family of products, typically have standard features that provide I/O for receiving digital and analog information and memory for user programs and standard functions. The selection of a particular controller chip, for example an eight bit chip (M68HC11) versus a sixteen bit chip (M68HC16), depends on the accuracy required for the frequency command to the VCO 16. Once selected, the controller chip could be programmed to provide a command to the VCO 16 to excite the crystal with a sinusoidal signal of a given frequency. As such, a suitable digital signal processor (DSP) device can be used to implement a number of the discrete functions shown in FIG. 1.

Assuming a purely capacitive phase shifter with capacitance, $C_O$, the crystal arrangement 12, which as shown is an equivalent representation of an actual crystal device, may be modeled by the following normalized first order equations which describe the four element resonant circuit of the crystal arrangement 12:

$$\frac{dv}{dt} = -\omega_o^2 q - \frac{\omega_o}{Q} v + \mu e_1 \quad (1)$$

$$\frac{dq}{dt} = v \quad (2)$$

$$e_2 = \frac{(C_O e_1 - q)}{(C_O + C_d)} \quad (3)$$

Where:

$C_O$=the capacitance across phase shifter 18;

$$\omega_O^2 = \frac{(C_O + C_d + C)}{LC(C_O + C_d)};$$

$$\mu = \frac{C_O}{L(C_d + C_O)}; \text{ and}$$

$$Q = \frac{(L/C)^{1/2}}{r}\left[\frac{C_O + C_d + C}{C_O + C_d}\right]^{1/2}$$

The variables q, v, $e_1$, and $\omega_o$ may be further defined as follows:

$$q = C[\xi\cos\omega t + \eta\sin\omega t] \quad (4)$$

$$v = C\omega[-\xi\sin\omega t + \eta\cos\omega t]$$

$$e_1 = E_1\cos(\omega t + \varphi)$$

$$\omega_O = \omega + \Delta\omega_O$$

where the variables $\xi$ and $\eta$ describe a response envelope of the crystal arrangement 12. Substituting the defining equations (4) for q and v into the differential equations of (1) and (2) above results in a pair of differential equations in terms of the envelope parameters $\xi$ and $\eta$. The envelope variables $\xi$ and $\eta$ are then assumed to vary slowly compared to a period of oscillation and the following differential equations for the envelope are obtained:

$$\frac{d\xi}{dt} = \Delta\omega_O\eta - \frac{\omega_O}{2Q}\xi + \frac{\rho E_1}{2}\sin\varphi \quad (5)$$

$$\frac{d\eta}{dt} = -\Delta\omega_O\xi - \frac{\omega_O}{2Q}\eta + \frac{\rho E_1}{2}\cos\varphi$$

$$\text{Where: } \rho = \frac{C_O}{(C_O + C_d + C)}$$

The error signal g and the signal h, can be characterized in terms of the response of the crystal arrangement 12 to the voltage-controlled oscillator 16 excitation by the following:

$$g = \frac{E_1^2}{2} - \left[\frac{C}{2C_O}\right]E_1(\xi\cos\varphi - \eta\sin\varphi) \quad (6)$$

$$h = \frac{E_1^2}{2} + \frac{1}{2}\left[\frac{C}{C_O}\right]^2(\xi^2 + \eta^2) - \left[\frac{C}{C_O}\right]E_1(\xi\cos\varphi - \eta\sin\varphi)$$

The control dynamics of the voltage-controlled oscillator 16 can be modeled as a sinusoidal signal with a given phase, as follows:

$$e_1 = E_1\cos(\omega t + \varphi) \quad (7)$$

Where:

$\omega$ is a constant "nominal frequency" parameter; and $e_1$ is the voltage-controlled oscillator output voltage.

Further, the change of phase, since the phase is a slowly varying function of time as compared with the period of oscillation, can be represented by:

$$\frac{d\varphi}{dt} = \Omega + \Omega_n \quad (8)$$

Where:

$\Omega$ is the command to the voltage-controlled oscillator in radian frequency; and $\Omega_n$ the frequency noise referred to the input of the voltage-controlled oscillator 16.

The feedback control law corresponding to the closed-loop mode of operation around the error signal g is defined as:

$$\frac{d\Omega}{dt} = -Kg \quad (9)$$

Where K is the gain of the feedback loop.

Equation (9) provides an integration so that a constant error in frequency g is integrated with respect to time and thus increases the command $\Omega$ to the voltage-controlled oscillator 16 until feedback decreases the error g and the command $\Omega$ settles to a constant value. The command $\Omega$ represents a proportional frequency change in the output signal $e_1$ of the voltage-controlled oscillator 16.

In order to determine how close the voltage-controlled oscillator 16 output frequency is to the resonant frequency of the crystal arrangement 12 the steady state response of the crystal resonant frequency sensor 10 is calculated from equations (5) through (9). In steady-state the phase $\Omega$ advances with constant frequency $\Omega_s$ and the value of the error signal g is equal to zero. Using classical sinusoidal methods, equations (5) through (9) above are solved to obtain the steady state condition for the error signal g:

$$g = \frac{E_1^2}{2} - \left(\frac{C}{C_O}\right)\left(\frac{\rho\omega_O E_1^2}{2}\right)\left[\frac{\Omega_s}{\Omega_s^2 + (\omega_O/2Q)^2}\right] = 0 \quad (10)$$

Equation (10) then must be solved for $\Omega_s$ in order to determine the corresponding resonant frequency of the crystal arrangement 12.

Figure 3:
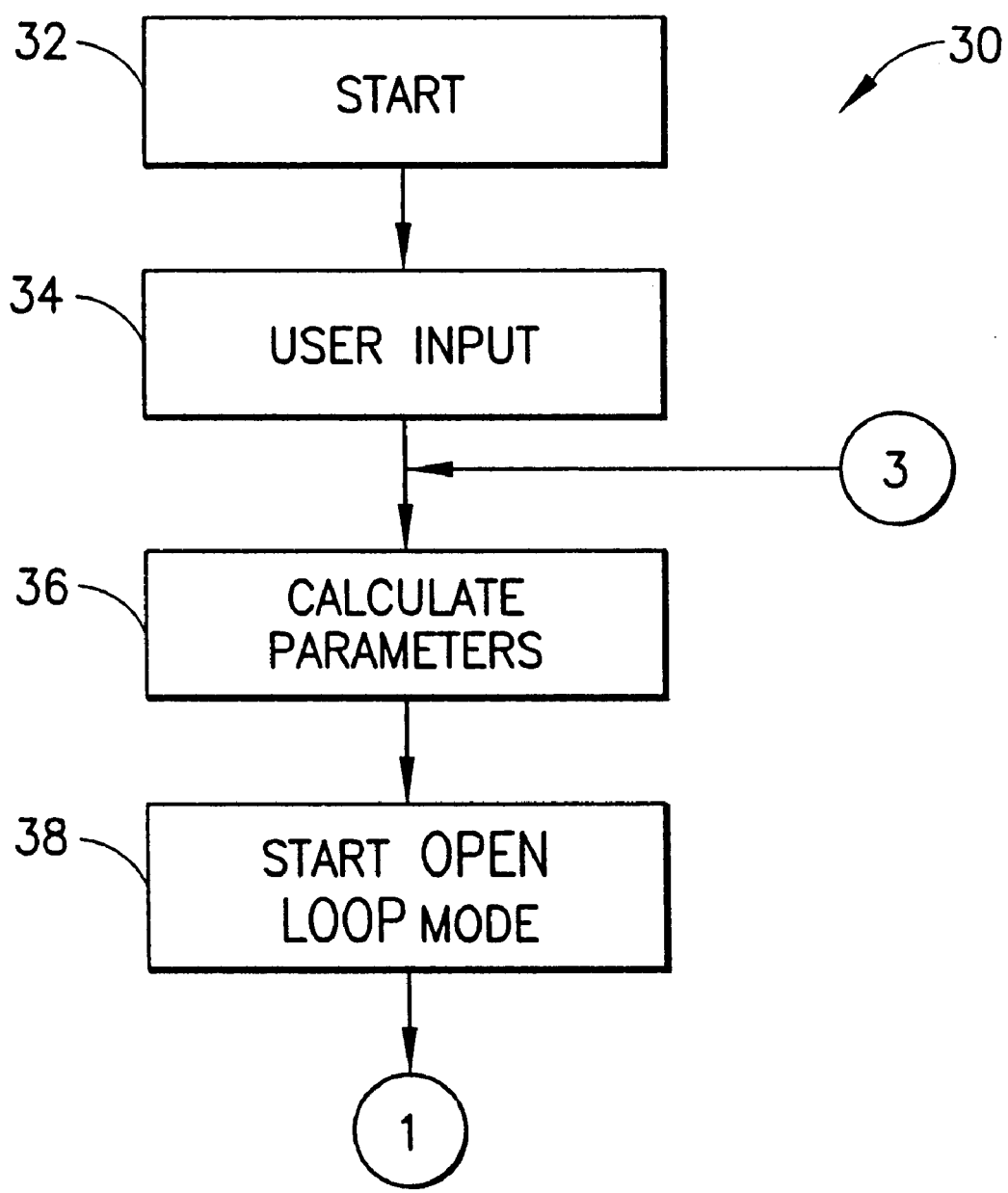
FIG. 3 is a flow chart depicting a first part of a method in accordance with this invention.
Figure 4:
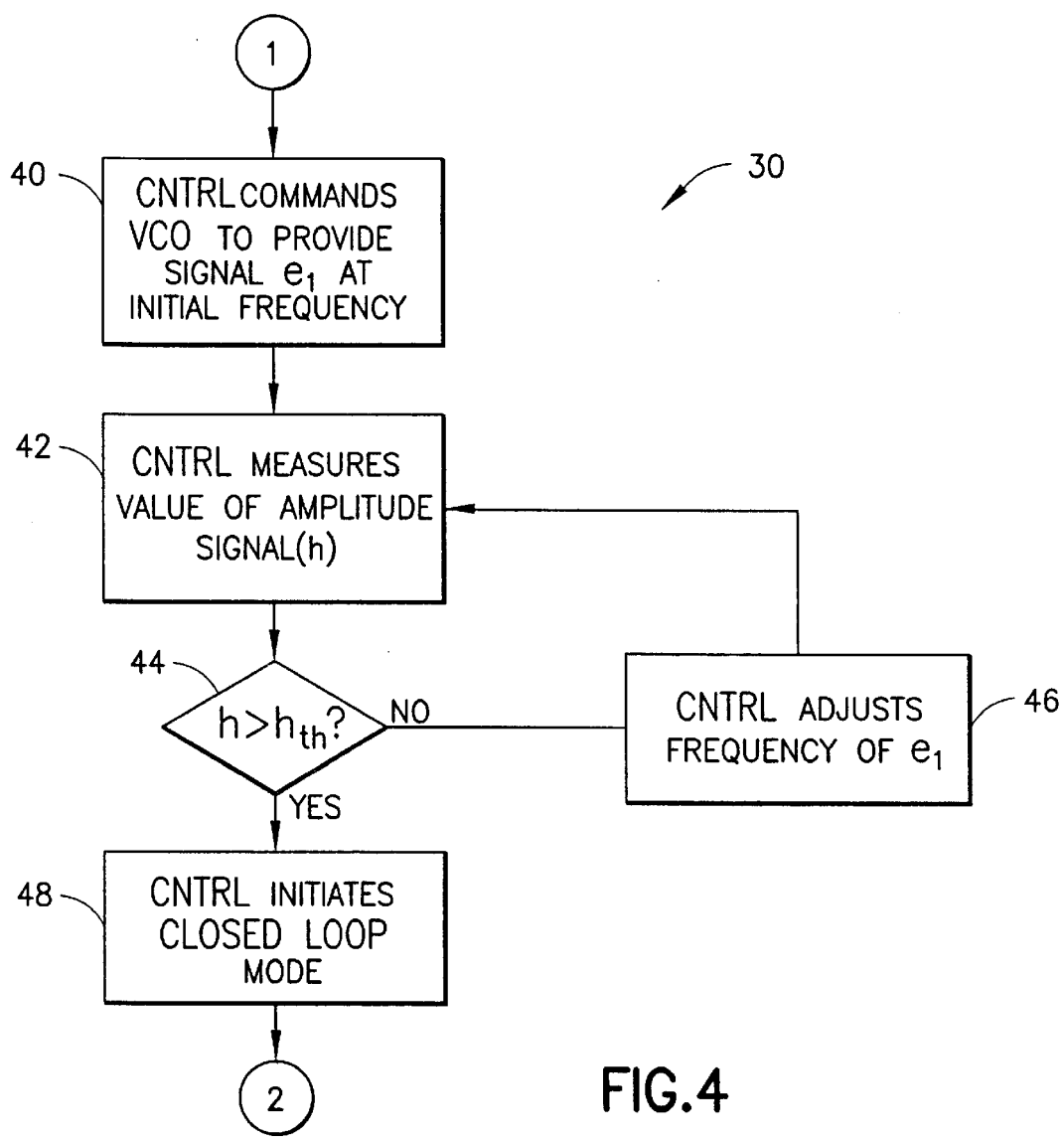
FIG. 4 is a flow chart depicting a second part of a method in accordance with this invention.
Figure 5:
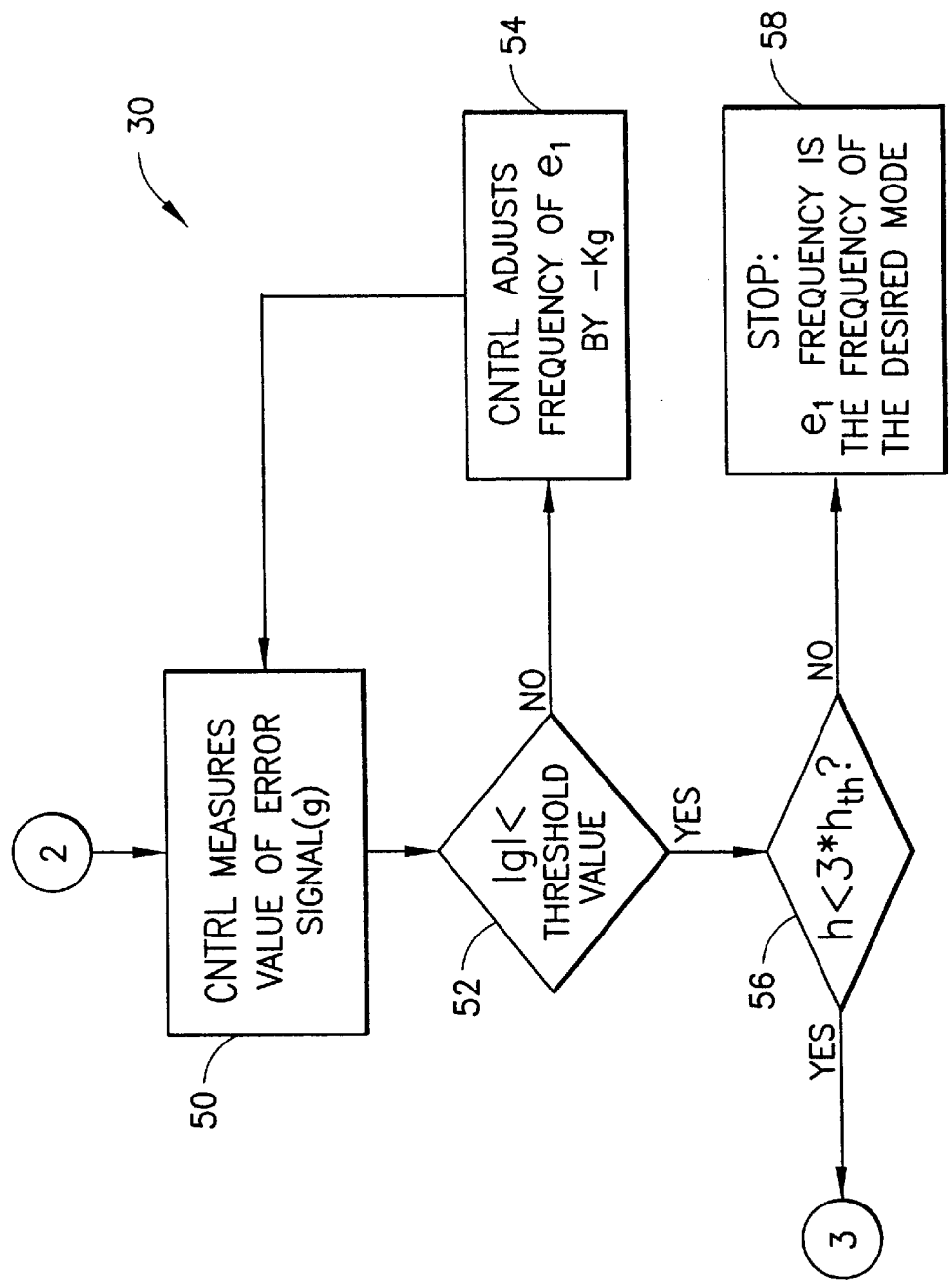
FIG. 5 is a flow chart depicting a third part of a method in accordance with this invention.

Referring now to FIG. 3, FIG. 4, and FIG. 5, a flow chart 30 is shown depicting a method in accordance with this invention. Specifically, FIG. 3 shows an initialization part of the method depicted in the flow chart 30 initiated with a first start step 32. Step 32 is followed by a step 34 where the user enters one or more parameters, as described above, into the controller 14 via an input device such as the keypad 14d. Upon receiving the user input the controller 14 calculates the operating parameters in a step 36. Once the operating parameters are calculated the open-loop mode of operation is initiated in a step 38.

Following the circled-1 to FIG. 4, in a step 40 the controller 14 commands the VCO 16 to provide the signal $e_1$ at a given frequency which was determined in step 36. The value of the amplitude signal h is then measured by the controller 14 in a step 42. In a step 44 the controller 14 compares the value of h with a predetermined value $h_{th}$ calculated in the step 36. If the value of h is less than the value of the signal $h_{th}$ the controller 14 commands the VCO 16 to adjust the frequency of signal $e_1$ in a step 46. Steps 42, 44, and 46 are repeated until the value of the signal h is greater than the value of the signal $h_{th}$. If, during the step 44, the value of signal h is determined to be greater than the value of the signal $h_{th}$ by the controller 14, the controller 14 initiates the closed-loop mode of operation in a step 48.

Following the circled-2 to FIG. 5, in a step 50 the controller 14 measures the value of the error signal g. In a step 52 the controller 14 determines whether the absolute value of the error signal g is less than the convergence value calculated in step 36. If the absolute value of the error signal g is found not to be less than the convergence value of the controller 14, the "NO" path is followed from step 52 to a step 54. In step 54, the controller 14 adjusts the control input to the VCO 16 such that the frequency of the signal $e_1$ is adjusted in proportion to the signal g, but in the opposite polarity to create a negative feedback control system well known to those well-versed in the art.

Steps 50, 52 and 54 are repeated until the absolute value of the error signal g is less than the convergence value. If, during the step 52, the absolute value of the error signal g is determined to be less than the convergence value by the controller 14, the controller 14, in step 56 determines if the closed-loop system has truly converged. For example, if the controller 14 measures the value of the signal h to be less than three times the predetermined value $h_{th}$ then the controller will recalculate the operating parameters and reinitiate the open-loop mode of operation, as depicted by following the circled-3 of FIG. 5 to the step 36 of FIG. 3. If the controller 14 determines that the closed-loop system has properly converged (for example h >3 $h_{th}$), the controller 14, in a step 58 stops the adjustment of the frequency of signal $e_1$.

Figure 6:
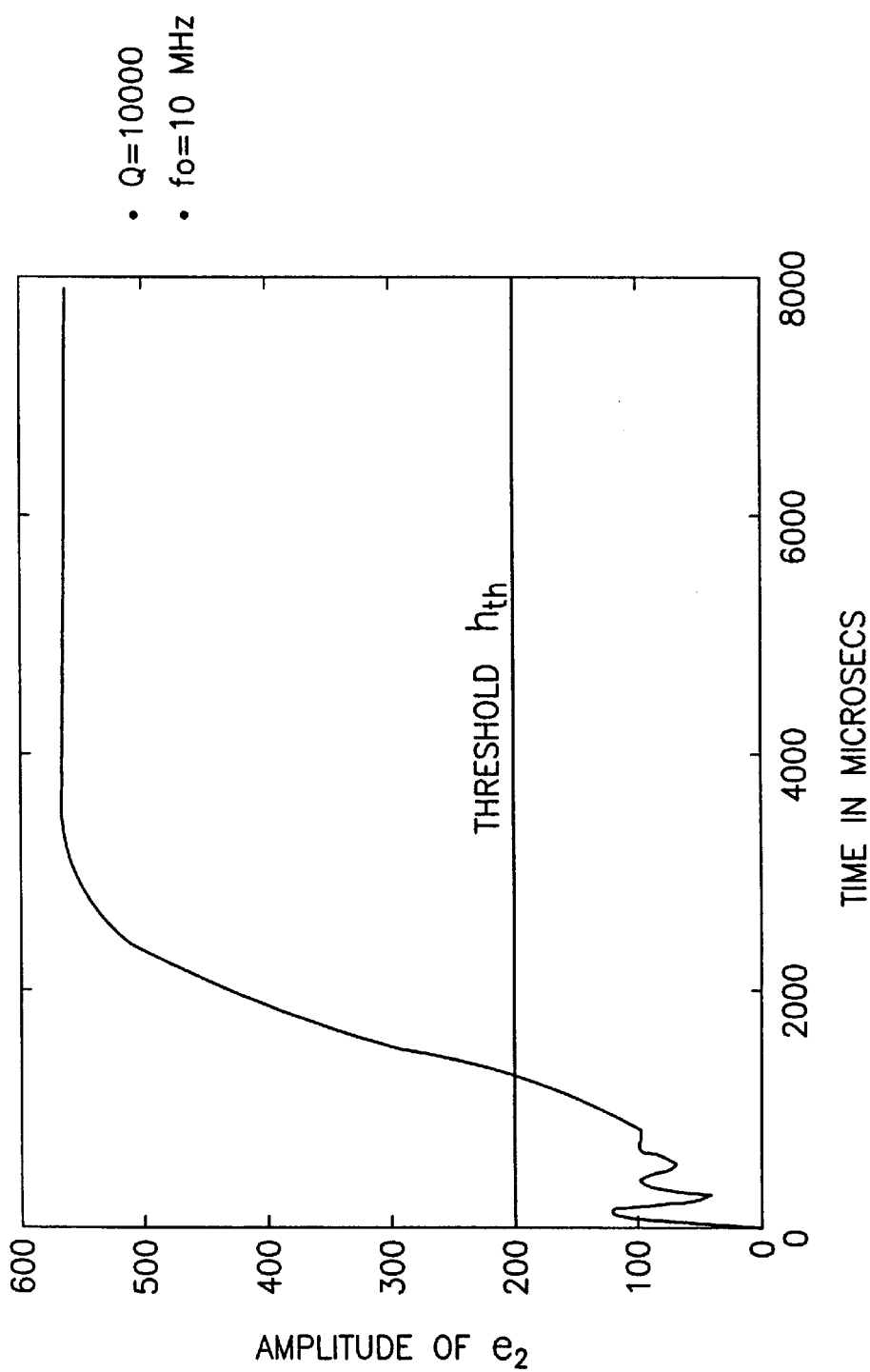
FIG. 6 is a graph that illustrates a first signal, the amplitude squared of oscillation, of a crystal resonant frequency sensor, plotted with respect to time.
Figure 7:
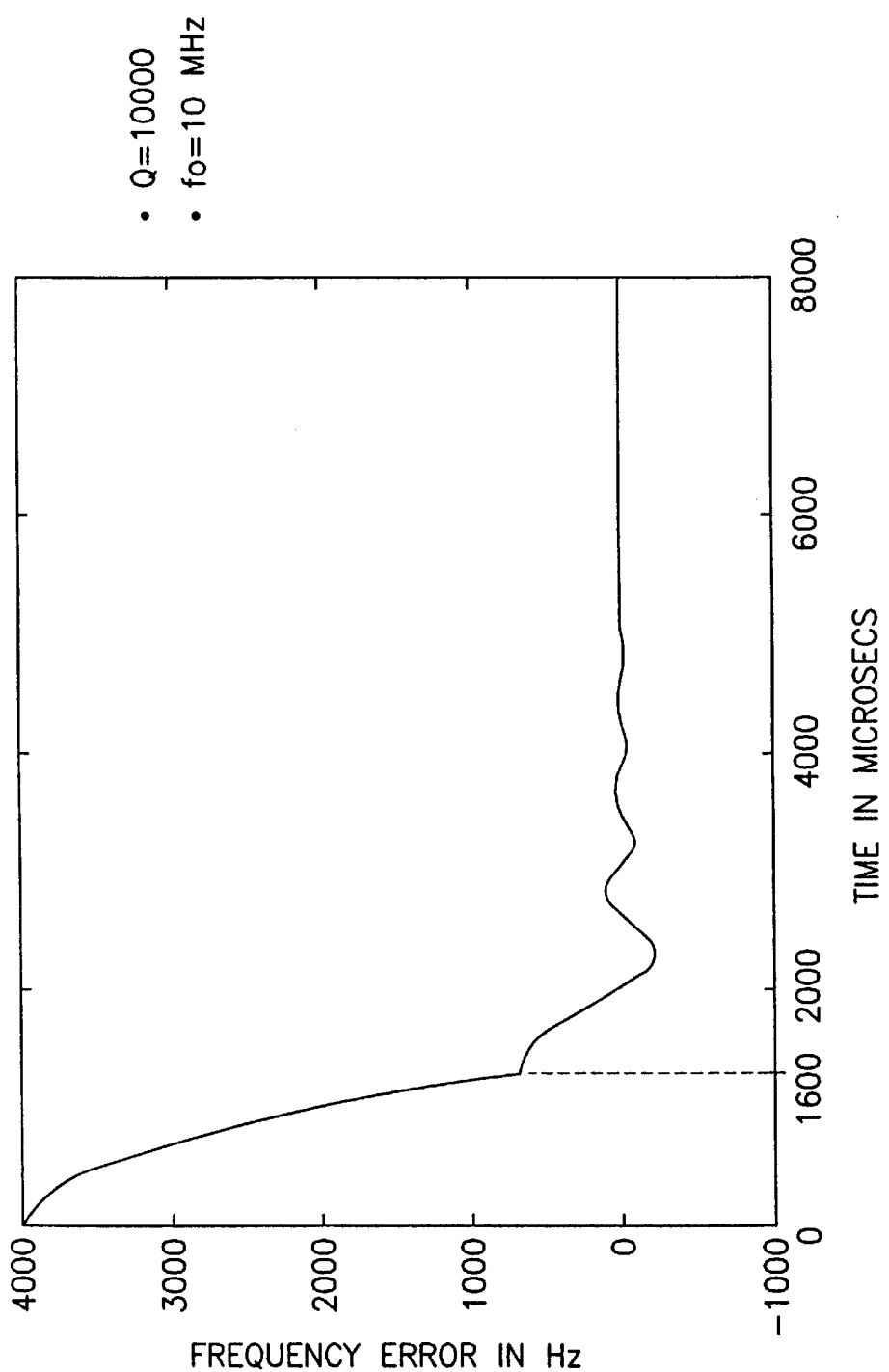
FIG. 7 is a graph that illustrates a second signal, the error or detuning in frequency, of a crystal resonant frequency sensor, plotted with respect to time.

Next, referring to FIG. 6 and FIG. 7 an example of a typical response of the crystal resonant frequency sensor 10 is shown. For this example the crystal arrangement 12 is considered to have a Q of 10,000 and a resonant frequency $f_o$ of 10 MHz. The calculated threshold value $h_{th}$ for this example is 200 (the units of FIGS. 6 and 7 are normalized units which represent a digital count). As is shown in the plot of FIG. 6, the crystal arrangement 12 may have several resonant modes. However, once the threshold value $h_{th}$ is achieved the closed-loop mode of operation is initiated and the amplitude of the signal $e_2$ increases as the output signal $e_1$ of the voltage controlled oscillator 16 approaches the resonant frequency of crystal arrangement 12.

FIG. 7 shows the frequency error in Hz converging from an initial value of 4 kHz to a final value of approximately zero Hz. The slope discontinuity of the curve in FIG. 7, at about time=1600 microseconds, coincides with the closure of the loop.

Using crystal oscillators to detect the presence of various chemicals is known in the art. For example, in U.S. Pat. No. 5,179,028 (Vali et al.) a high Q crystal oscillator is used to measure concentrations of specific chemicals of interest in the general vicinity of the high Q crystal oscillator. It can be appreciated that the operation of the crystal resonant frequency sensor 10 of this invention can be applied to advantage in the determination of chemical concentrations as described in Vali et al., since the crystal resonant frequency sensor 10 efficiently determines the resonant modes of the high Q crystal oscillator, representing the presence of a chemical of interest. That is, the teaching of this invention can be employed to determine resonator properties which are influenced by an external agency, such as a change in mass due to the presence of a chemical species of interest, a change in temperature, a change in pressure, and other factors that can influence the resonant modes of a resonator.

Figure 8:
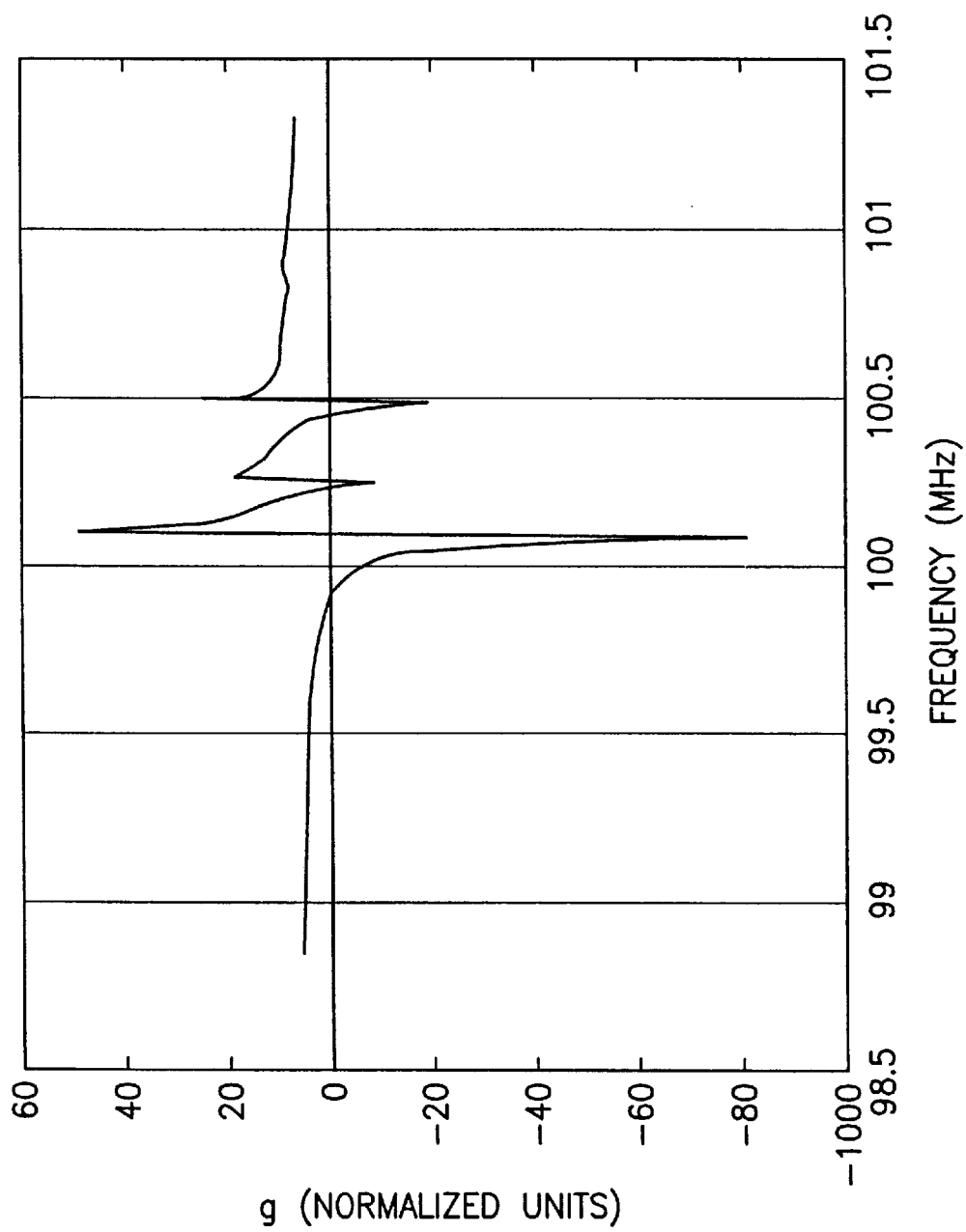
FIG. 8 is a graph that illustrates a normalized signal, h of a crystal circuit, plotted with respect to frequency.

In FIG. 8, a normalized input signal is plotted with respect to frequency. FIG. 8 illustrates the oscillatory properties of a device under test by a frequency sensor in accordance with the present invention. As shown, there are three points at which the signal goes to zero. The three points represent three, closely spaced resonant frequencies of the device under test. The later two points represent spurious resonance and are generally undesirable. While undesirable, measurements which detail the spurious resonance of a device under test reveal information about the transverse oscillatory properties of the device. Thus, reducing the transverse oscillatory properties improve the design of the device. It is possible, by varying the phase shifter 18, to improve the selectivity of the later two points and thus improve the precision of the estimates of all three frequencies. Such variations might include varying the capacitance of a purely capacitive phase shifter or including other passive elements such as an inductor or a combination of passive elements.

Figure 9:
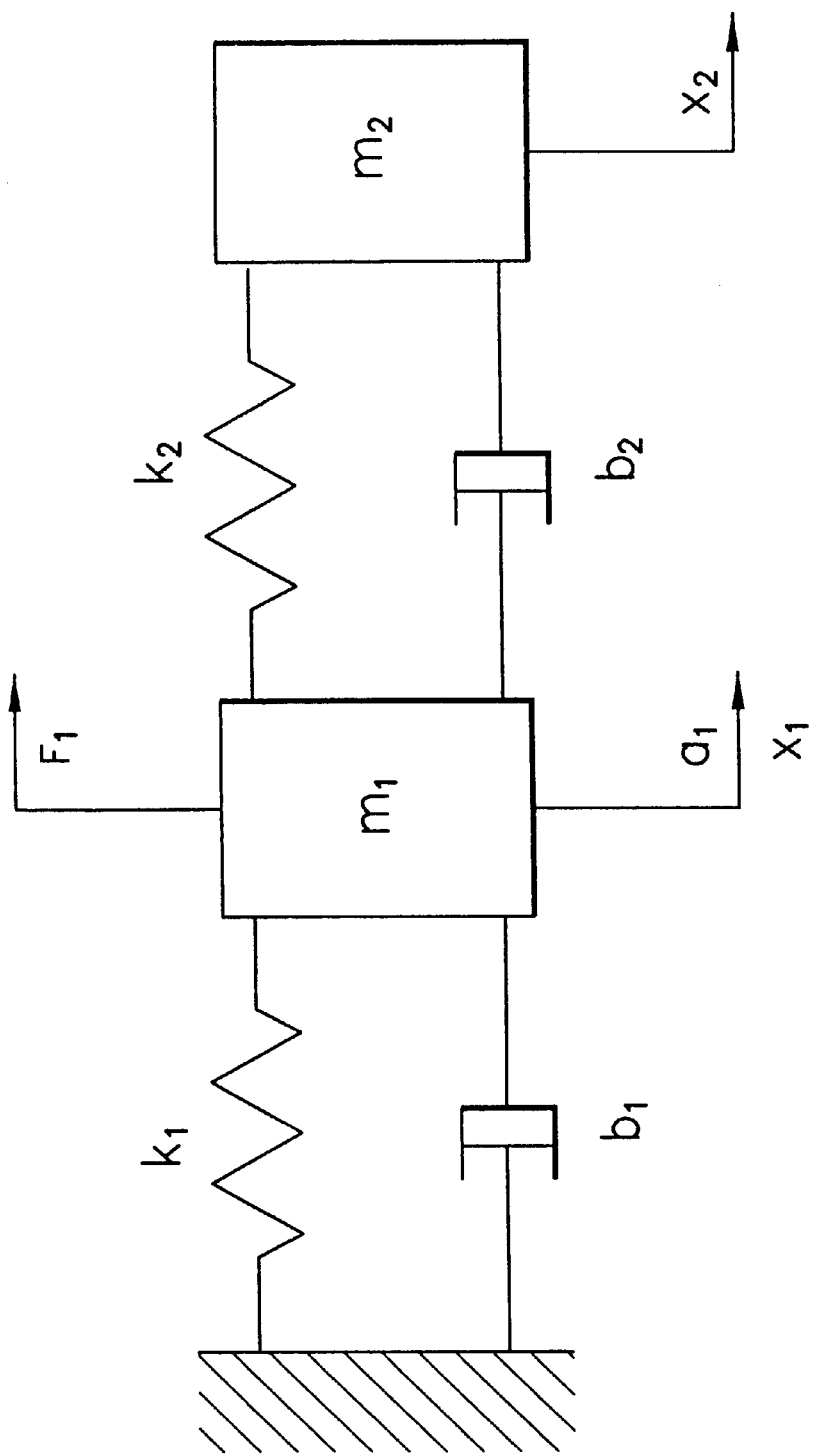
FIG. 9 is a schematic diagram of a two-port mechanical structure whose resonant characteristics can be measured by the present invention.

In FIG. 9, a schematic diagram of a two-part mechanical structure whose resonant characteristics can be measured by the present invention is shown. As in the above discussion of the Vali et al. patent, the resonant characteristics of a highly oscillatory system, either mechanical or electrical, can be measured with the crystal resonant frequency sensor 10 and the evaluation method as outlined above. Thus, the teachings of this invention can be employed to determine resonator properties which are influenced by an external agency. That is, the sensor can measure an acceleration $a_1$ determined by masses $m_1$ and $m_2$, springs $k_1$ and $k_2$, dampers $b_1$ and $b_2$, and an applied force $F_1$. The applied force $F_1$, and corresponding acceleration $a_1$ result in movements $x_1$ and $x_2$ of the masses $m_1$ and $m_2$, respectively.

Accordingly, an electrical signal from the VCO may be sent to a linear, electromagnetic actuator, such as a BEI model LA-30-27-001 which is capable of producing a desired force for a desired current. The resultant acceleration of the mass could be measured using a variety of accelerometers such as an Entran Model EGCS-A1-2/Z1/L2M/RS, which provides a voltage proportional to acceleration. The output of the phase shifter 12a may be used to drive the linear actuator. The signal $e_2$ would be the output of the accelerometer. Otherwise, the operation of the sensor 10 proceeds substantially as described previously.

Figure 10:
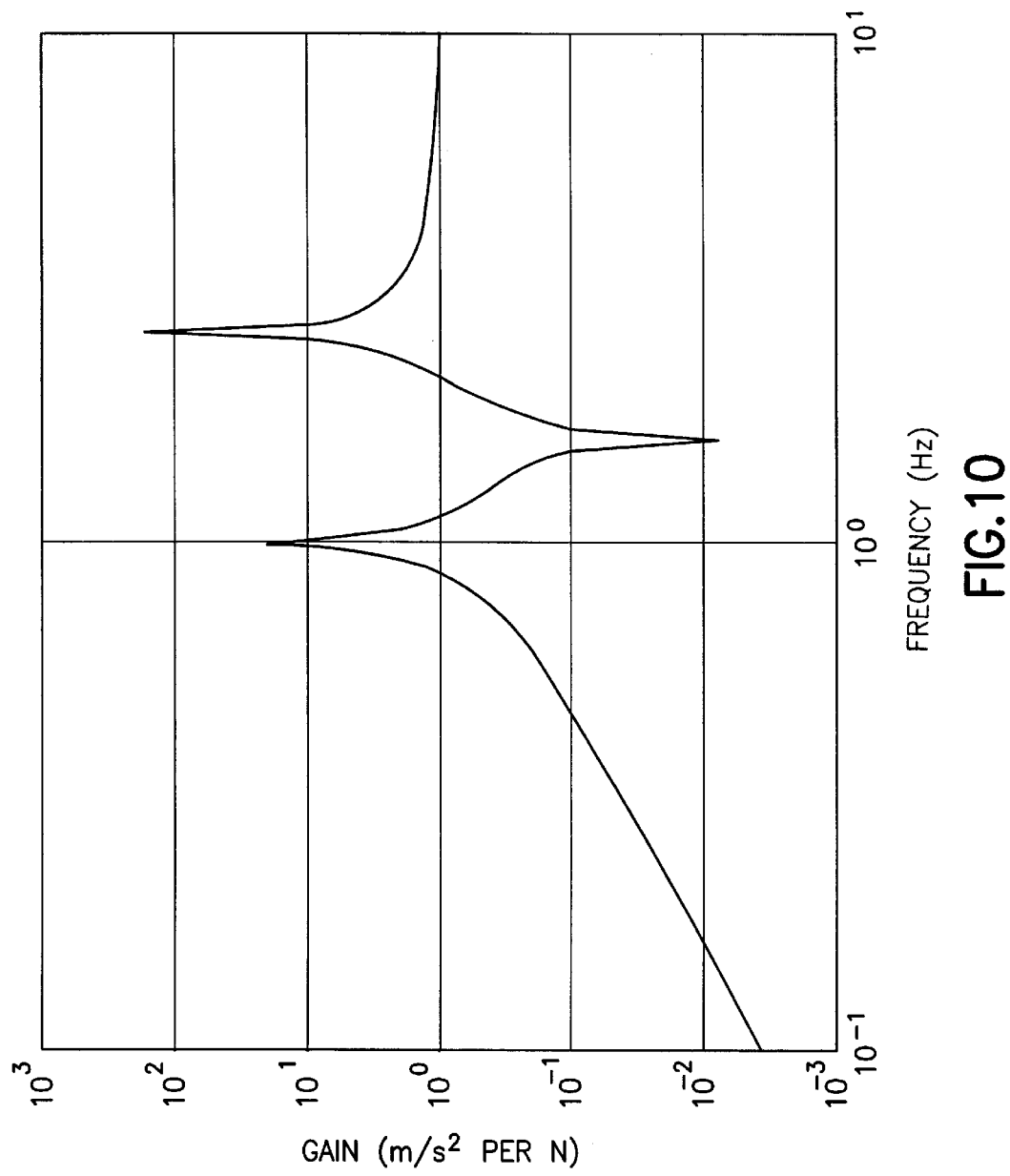
FIG. 10 is a graph that illustrates a normalized signal, h of a two-port mechanical system, plotted with respect to frequency around the first resonant peak.
Figure 11:
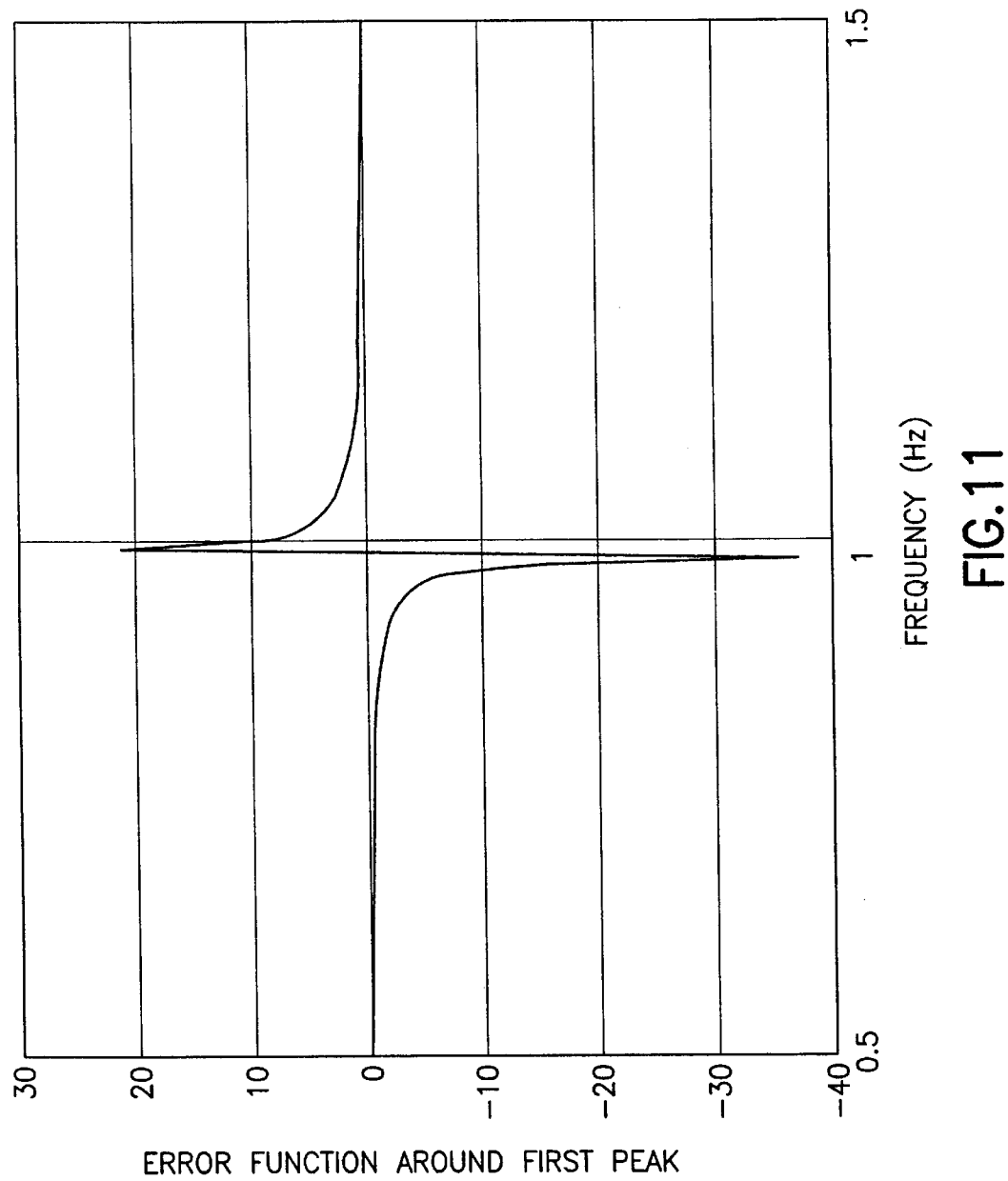
FIG. 11 is a graph that illustrates a normalized signal, g of a two-port mechanical system, plotted with respect to frequency around the second resonant peak.
Figure 12:
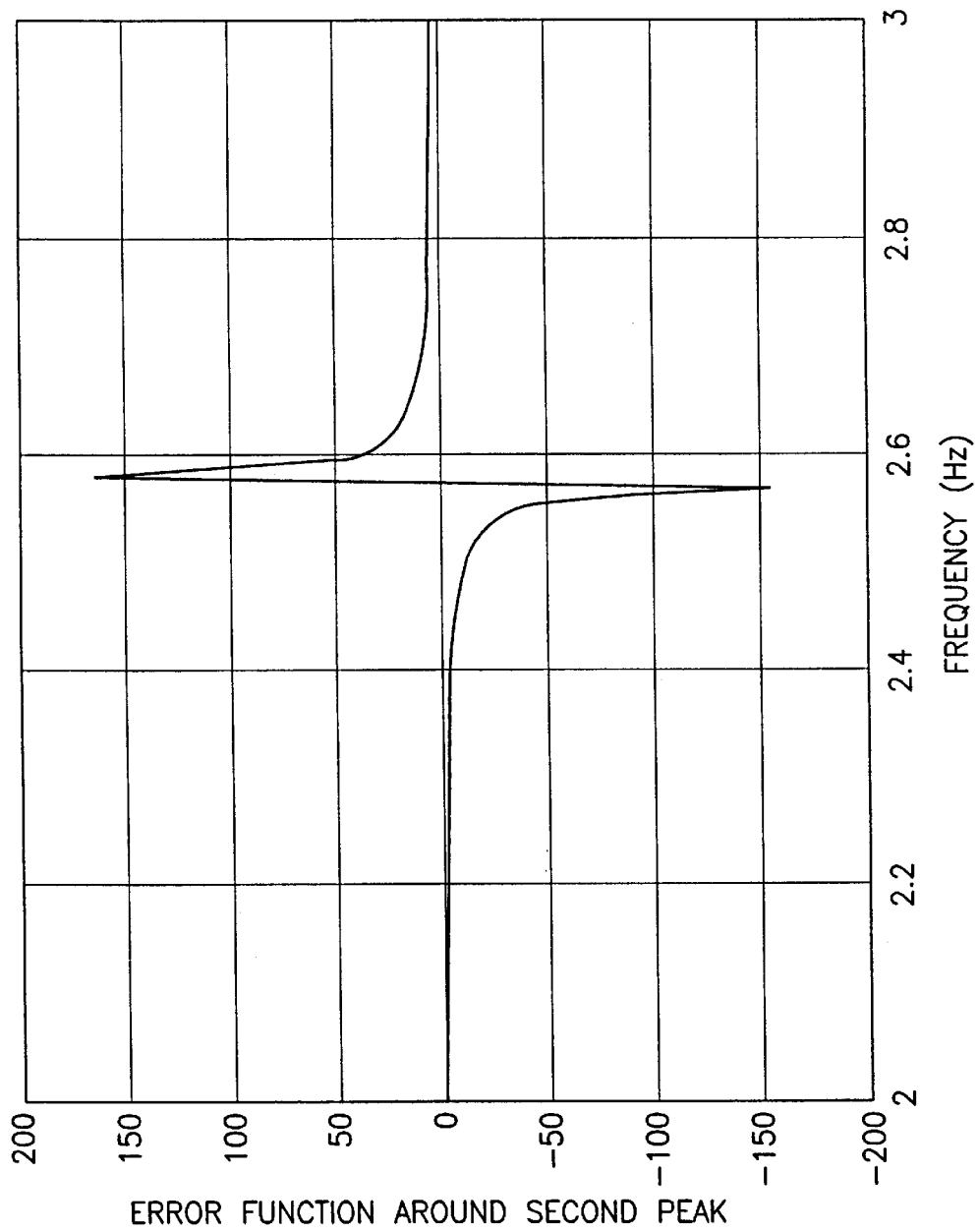
FIG. 12 is a graph that illustrates a normalized signal, g of a two-port mechanical system, plotted with respect to frequency around the second resonant peak.

As an example of the response of this mechanical system, FIG. 10 shows the magnitude of the acceleration of mass $m_1$ for constant amplitudes of force at various signals. The graph in FIG. 10 showing the response of the mechanical system has more than one resonant peak. Using a purely capacitive phase shifter as before, the expected error signal g may be calculated. This is shown in FIG. 11 for the first peak and FIG. 12 for the second peak. This signal provides a very linear region around the resonant point of the system.

Though the present invention has been described with particular reference to the crystal resonant frequency sensor 10, the teachings of this invention may be used in a precision, linear, crystal-controlled oscillator. In this case, the controller would continue to operate continuously in the closed-loop mode. Here, the convergence value may signal that the circuit was oscillating stably at the desired frequency. The output of the VCO provides the output of the system that could be used for a variety of applications. This approach greatly relaxes the manufacturing tolerances on crystals for use in precision oscillators.

Thus, while the invention has been particularly shown and described with respect to preferred embodiments thereof, it will be understood by those skilled in the art that changes in form and details may be made therein without departing from the scope and spirit of the invention.

What is claimed is:

1. A sensor for measuring the frequency of a desired resonant mode of a crystal arrangement, comprising:

a voltage-controlled oscillator, having an input and an output, for generating at said oscillator output a signal whose frequency is responsive to a command signal at said input of said oscillator; and a phase shifter having an input and an output, said input of said phase shifter electrically coupled to said output of said voltage-controlled oscillator, said crystal arrangement electrically connected in shunt with said output of said phase shifter;

a first multiplier circuit having two inputs, both being coupled with the output of the phase shifter wherein a passive response of said crystal arrangement is multiplied with itself by said first multiplier circuit to generate a first signal having a characteristic amplitude versus frequency curve which peaks substantially at the frequency of the desired resonant mode of the crystal arrangement;

a second multiplier circuit having two inputs, one being coupled with the output of the voltage-controlled oscillator and the other being coupled with the output of the phase shifter wherein the two inputs are multiplied by said second multiplier circuit to generate a second signal having a characteristic amplitude versus frequency curve which crosses a predetermined value substantially at the frequency of the desired resonant mode of the crystal arrangement, said crossing occurring within a frequency range in which the first signal is above a predetermined threshold value; and a controller for generating said command signal based on values of said first and second signals;

wherein said voltage-controlled oscillator, said phase shifter, said first and second multiplier circuits and said controller form a control loop, wherein said controller adjusts said command signal such that said first signal approaches the predetermined threshold value and said second signal approaches the predetermined value, wherein when said first signal exceeds the predetermined threshold value and said second signal equals substantially the predetermined value the frequency of said output signal of said voltage-controlled oscillator is correlated with the frequency of said desired resonant mode of said crystal arrangement.

2. A sensor as in claim 1, wherein said predetermined value is zero.

3. A sensor as in claim 1, wherein said phase shifter is comprised of a capacitor.

4. A sensor as in claim 1 further comprising:

a first filter circuit electrically disposed between said output of said first multiplier and said controller, said first filter circuit being responsive to said first signal for providing a filtered first signal to said controller; and a second filter circuit electrically disposed between said output of said second multiplier and said controller, said second filter circuit being responsive to said second signal for providing a filtered second signal to said controller.

5. A sensor as in claim 1, wherein said controller is programmable, and further comprising means for programming said programmable controller.

6. A sensor as in claim 5, wherein said means for programming said programmable controller includes an input device for passing user inputted parameters to said programmable controller.

7. A sensor as in claim 1 wherein the controller comprises a microprocessor.

8. A sensor for measuring the resonant frequency of multiple, closely spaced modes of a crystal arrangement, comprising:

a voltage-controlled oscillator having an input and an output, said oscillator being adapted to provide an oscillating output signal whose frequency is responsive to a command signal at said input of said oscillator;

a programmable phase shifter having an input and an output, wherein an error signal is generated which is proportional to a phase difference between said input of said programmable phase shifter and said output of said programmable phase shifter, said input of said programmable phase shifter electrically coupled to said output of said voltage-controlled oscillator, wherein said crystal arrangement being electrically connected in shunt with said output of said programmable phase shifter; means for programming said programmable phase shifter;

a first multiplier circuit having at least two inputs and one output, two of said inputs of said first multiplier being electrically coupled with said output of said programmable phase shifter, wherein a passive response of said crystal arrangement is amplified;

a second multiplier circuit having at least two inputs and one output, one of said inputs being electrically coupled with said output of said voltage-controlled oscillator, the second of said inputs being electrically coupled to said output of said programmable phase shifter;

a controller having at least two inputs and at least one output, wherein said output is electrically coupled to said input of said voltage-controlled oscillator for providing said command signal to said voltage-controlled oscillator, one of said inputs is electrically coupled to said output of said first multiplier, and a second of said inputs is electrically coupled to said output of said second multiplier;

a first filter circuit electrically dispose between said output of said first multiplier and said controller, said first filter circuit having an input and an output and being responsive to said output of said first multiplier applied to said input of said first filter circuit for providing a filtered output signal to said first input of said controller, said output of said first filter circuit defining a signal proportional to an amplitude response of said crystal arrangement to said oscillating output signal of said voltage-controlled oscillator; and a second filter circuit electrically disposed between said output of said second multiplier and said controller, said second filter circuit having an input and an output and being responsive to said output of said second multiplier applied to said input of said second filter circuit for providing a filtered output signal to said second input of said controller, wherein said output of said second multiplier defining an error signal indicative of one of said multiple resonant modes of said crystal arrangement;

when in an open-loop mode, said voltage-controlled oscillator, said programmable phase shifter, said first multiplier, said first filter, and said controller form a control loop, wherein said output of said programmable phase shifter is adjusted until said output exceeds a predetermined threshold value;

when in a closed-loop mode, said voltage-controlled oscillator, said programmable shifter, said second multiplier, said second filter, and said controller form the control loop, wherein said output of said programmable phase shifter is adjusted until the value of said error signal equals a predetermined value, whereby the frequency of said oscillating output of said voltage-controlled oscillator is correlated with the frequency of one of said multiple modes of said crystal arrangement.

9. A method for determining the frequency of a desired resonant mode of a crystal arrangement, comprising the steps of:

calculating operating parameters related to the desired resonant mode of the crystal arrangement, the operating parameters comprising a frequency range of operation, a final error value, and a threshold value;

providing a control signal to a voltage-controlled oscillator, wherein the frequency of a sinusoidal output signal of the voltage-controlled oscillator is responsive to the control signal; and providing the sinusoidal output signal of the voltage-controlled oscillator to the crystal arrangement wherein the frequency of the sinusoidal signal being within the calculated frequency range, the sinusoidal output signal first passing through a phase shifter having an input and output, wherein an error signal is generated which is proportional to a phase difference between the input of the phase shifter and the output of the phase shifter, when in an open-loop mode, measuring a response of the crystal arrangement to the sinusoidal output signal;

in the open-loop mode, adjusting the frequency of the sinusoidal output signal until the value of the measured response of the crystal arrangement is greater than the calculated threshold value;

when in a closed-loop mode, measuring the error signal; and in the closed-loop mode, adjusting the frequency of the sinusoidal output signal until the value of the measured error signal is equal to the calculated final error signal value, whereby the frequency of the sinusoidal output signal is the frequency of the desired resonant mode of the crystal arrangement.

10. A method as in claim 9, wherein the step of calculating operating parameters further comprises the step of calculating a system gain, wherein the rate at which the frequency of the sinusoidal signal can be adjusted is increased such that less time is required to determine the frequency of the desired mode of the crystal arrangement.

11. A method as in claim 9, wherein the step of adjusting the frequency of the sinusoidal signal until the value of the measured response of the crystal arrangement is greater than the calculated threshold value further comprises the step of adjusting the control signal to the voltage-controlled oscillator, wherein the frequency of the sinusoidal output of the voltage-controlled oscillator sweeps within the calculated frequency range, and wherein the value of the response of the crystal arrangement approaches the calculated threshold value.

12. A method as in claim 11, wherein the step of adjusting the frequency of the sinusoidal signal until the value of the measured error signal is equal to the calculated final error signal value further comprises the step of adjusting the control signal to the voltage-controlled oscillator wherein the frequency of the sinusoidal output of the voltage-controlled oscillator is finely adjusted within the calculated frequency range, and wherein the value of the response of the crystal arrangement approaches the calculated final error value.

13. A method for determining the resonant frequency of multiple, closely spaced modes of a crystal arrangement, comprising the steps of:

calculating operating parameters related to one of the multiple, closely spaced resonant modes of the crystal arrangement, the operating parameters comprising a frequency range of operation, a final error value, and a threshold value;

providing a control signal to a voltage-controlled oscillator, wherein the frequency of a sinusoidal output of the voltage-controlled oscillator is responsive to the control signal, and the frequency of the sinusoidal output of the voltage-controlled oscillator is within the calculated frequency range;

providing the sinusoidal output of the voltage-controlled oscillator to the crystal arrangement, the sinusoidal output first passing through a phase shifter having an input and an output, wherein an error signal is generated which is proportional to the phase difference of said input of said phase shifter and said output of said phase shifter;

when in an open-loop mode, measuring a response of the crystal arrangement to the sinusoidal output;

in the open-loop mode, adjusting the control signal to the voltage-controlled oscillator, wherein the frequency of the sinusoidal output of the voltage-controlled oscillator sweeps within the calculated frequency range, and wherein the value of the response of the crystal arrangement approaches and exceeds the calculated threshold value;

when in a closed-loop mode, measuring the error signal; and in the closed-loop mode, adjusting the control signal to the voltage-controlled oscillator wherein the frequency of the sinusoidal output of the voltage-controlled oscillator is finely adjusted within the calculated frequency range until the value of the measured error signal is equal to the calculated final error signal value, whereby the frequency of the sinusoidal output is the frequency of one of the multiple, closely spaced resonant modes of the crystal arrangement.

* * * * *